United States Patent [19]

Wolfram

[11] 3,766,483

[45] Oct. 16, 1973

[54] SIGNAL SEEKING TUNER CONTROL SYSTEM

[75] Inventor: Adolf E. Wolfram, Portsmouth, Va.

[73] Assignee: General Electric Company, Portsmouth, Va.

[22] Filed: June 29, 1971

[21] Appl. No.: 158,013

[52] U.S. Cl. .................... 325/470, 325/319, 334/16

[51] Int. Cl. .................... H04b 1/32

[58] Field of Search .................... 325/335, 418–423, 325/464, 468–470, 318, 319; 334/14–16, 18

[56] References Cited

UNITED STATES PATENTS

| | | | |
|---|---|---|---|
| 3,456,196 | 7/1969 | Schneider | 325/420 |
| 3,492,584 | 1/1970 | Takahashi | 325/470 X |
| 3,467,870 | 9/1969 | Aoyama | 325/470 |
| 3,467,871 | 9/1969 | Morici | 325/470 |

*Primary Examiner*—Robert L. Griffin
*Assistant Examiner*—Marc E. Bookbinder
*Attorney*—Stanley C. Corwin et al.

[57] ABSTRACT

A tuner control having three discrete states for raising, lowering or maintaining frequency of a voltage controlled tuner. Oppositely phased bi-polar error voltages derived from a discriminator are applied to the input terminals of the control. When the converted frequency outputted by the tuner is at a desired value, indicating reception of a carrier signal, no error voltage is produced and the signal-seeking device is disabled. However, when the converted signal deviates from a desired frequency range, an error voltage is derived. The phase and polarity of the error voltage which is then developed causes the network to produce either a first, higher or a second, lower voltage to cause a controlled voltage applied to the tuner to rise or fall. The tuner is thus caused to home in on a desired, central frequency range. When the desired frequency range is attained, the error voltage recedes to a level which allows the tuner control to become disabled once more.

10 Claims, 2 Drawing Figures

INVENTOR
ADOLF E. WOLFRAM
BY *James E. Espe*
HIS ATTORNEY

SIGNAL SEEKING TUNER CONTROL SYSTEM

BACKGROUND OF THE INVENTION

The present invention relates to tuners for television receivers and, more particularly, to a signal-seeking system for controlling the operation of a tuning stage.

Until recently, most television receiver tuners have comprised electro-mechanical devices wherein the tuning of a reference oscillator is achieved by mechanically switching resonant circuit elements in and out of a tuned circuit, or by mechanically varying the resonance of selected portions of a tuned circuit. Recently, however, voltage-controlled tuners having no moving parts therein have become available. Such tuners incorporate the obvious advantages that attend the lack of moving elements such as freedom from breakage, wear and corrosion. Voltage controlled tuners ordinarily comprise electronic devices having no moving parts, the resonance of selected portions of the tuner being modified through the use of devices such as voltage-controlled capacitors or varicaps. The capacitance of the varicap and thus the resonant frequency of a circuit in which it is incorporated, may be changed by varying the D.C. voltage thereacross.

Many approaches can be taken for providing a controlled, variable voltage for operating such a device. However, unless circuit parameters are fully predictable, and means provided to insure that the controlled voltage will not vary perceptibly, the frequency of the tuner will tend to drift. Unfortunately, most of the economical means for providing controlled, variable D.C. voltage do not readily lend themselves to automatic frequency control (AFC) operation. AFC is particularly desirable in color television receivers for maintaining the converted frequency outputted by a tuner at a constant value despite fluctuations in the characteristics of a received signal or of the tuner itself. In the present context, it has been found desirable to provide an AFC function to correct the control voltage applied to a voltage controlled tuner. Existing AFC networks designed for use with manual tuners do not have an adequate voltage range for providing wide-band control to a voltage-controlled tuner. Further, most AFC networks do not lend themselves to use with a variable-voltage tuner control. It will therefore be seen that it would be desirable to provide improved, economical AFC for maintaining a consistent output from a voltage controlled tuner.

It is therefore an object of the present invention to provide improved means for implementing automatic frequency control in a television receiver.

It is a further object of the present invention to provide improved means for maintaining the frequency of a signal outputted by a voltage controlled tuner at a predetermined value.

SUMMARY OF THE INVENTION

Briefly stated, in accordance with one embodiment of the present invention there is provided a ramp generator for producing a continuously variable voltage which may be applied to the control terminal of a voltage controlled tuner. A tuner control is provided to receive oppositely-phased error voltages produced by a frequency discriminator, the relative phase and polarity of the error voltages operating the control means so as to "home in" on a desired signal frequency. When an error voltage having a first polarity and phase characteristic is produced, the control means acts to apply a first, higher voltage to the ramp generator for causing the control voltage applied to the tuner to increase. Similarly, when an error voltage having a second polarity and phase characteristic is produced, the control means is energized in an opposite mode and applies a second, lower voltage to the ramp generator for causing the control voltage applied to the tuner to decrease. When the converted carrier frequency outputted by the tuner approaches the predetermined, central frequency range the discriminator output error voltage assumes a level which allows the control means to be disabled. Switch means are operated to disconnect the de-energized control from the ramp generator so that the ramp generator continues to produce a fixed, constant voltage to the voltage control tuner. Upon subsequent deviations by the converted carrier signal from the desired central frequency range, the control circuit is re-energized by the resulting error voltage closing the switch and applying a suitable control voltage to the ramp generator for causing the converted signal to re-enter the desired central frequency range.

BRIEF DESCRIPTION OF THE DRAWING

While the specification concludes with claims particularly pointing out and distinctly claiming the subject matter which is regarded as the invention, it is believed that the invention will be better understood from the following description of the preferred embodiment taken in conjunction with the accompanying drawing, in which:

DESCRIPTION OF THE PREFERRED EMBODIMENT

Figure 1:
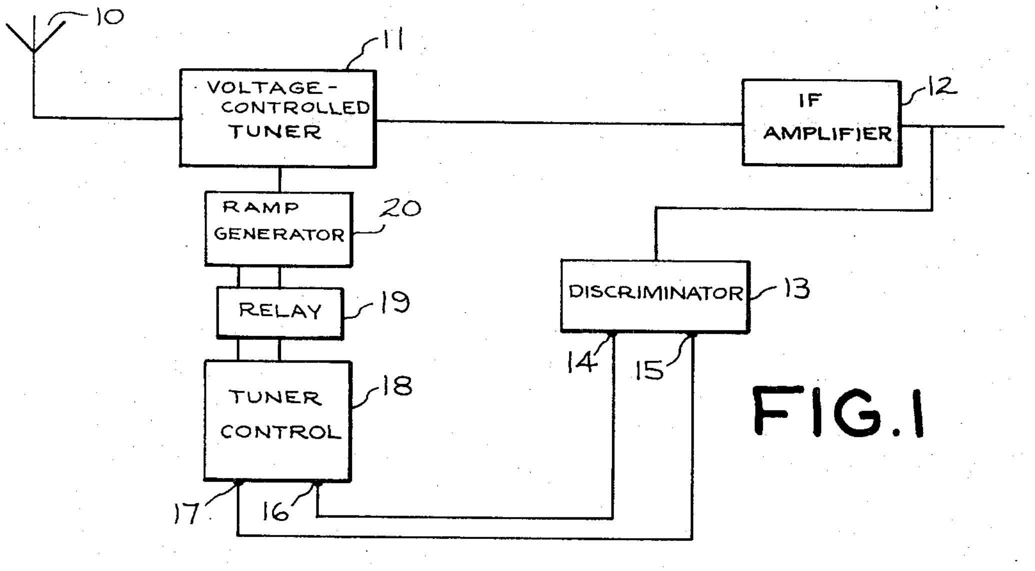
FIG. 1 is an idealized diagram of selected portions of a television receiver, including the inventive control system.

FIG. 1 discloses the broad elements of the inventive device in conjunction with selected portions of a conventional television receiver. Radio frequency (RF) signals are sensed by an antenna 10 and applied to a voltage-controlled tuner 11. The tuner operates in a manner well known to those skilled in the art to produce a converted signal which is transferred to an intermediate frequency (IF) amplifier 12 having one or more stages. The converted signal outputted by the amplifier is also applied to a discriminator 13 which outputs error voltage representative of the difference in frequency between a selected portion of the converted signal, and a desired central frequency $f_o$. Should such a difference be present, DC voltages of proportional magnitudes but of opposing polarities are produced at the output terminals 14 and 15 of discriminator 13. For example, if the sensed component of the converted frequency is lower than the desired frequency an error voltage less positive with respect to a reference voltage will appear at first output terminal 14, while an oppositely-phased error voltage, more positive with respect to the reference, appears at output terminal 15. Similarly, if the sensed portion of a converted frequency is above the desired frequency $f_o$ the error voltage at terminal 14 becomes more positive, while that at terminal 15 becomes less positive. The error voltages thus produced at output terminals 14 and 15 are applied to corresponding input terminals 16 and 17, respectively, of tuner control 18. The tuner control acts in a manner to be explained hereafter to close a switch in relay 19 which serves to couple voltages outputted by control 18 to a ramp generator 20. When a first, higher or second, lower voltage is applied to the ramp generator, its output voltage is caused to increase or to decrease, modifying the resonance of elements within voltage-controlled tuner 11 such that the converted frequency outputted by the tuner is caused to approach a desired central frequency $f_o$.

Figure 2:
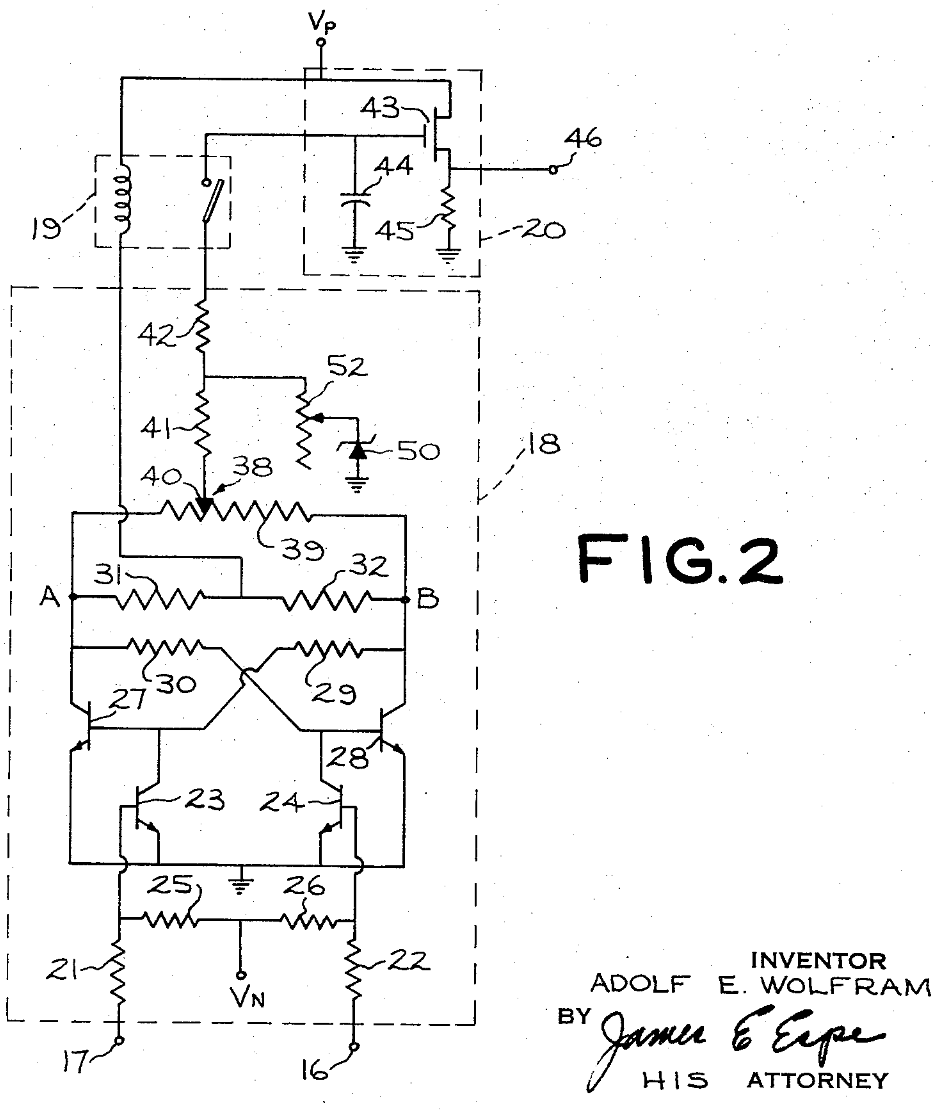
FIG. 2 is a schematic diagram of a preferred embodiment of the inventive system.

FIG. 2 shows in schematic form the tuner control 18, relay 19 and ramp generator 20 of FIG 1, including the components thereof. A pair of decoupling resistors 21 and 22 connect input terminals 17 and 16 to shunting transistors 23 and 24, respectively. Resistors 25 and 26 couple the bases of transistors 23 and 24, respectively, to a suitable source of negative potential $V_n$. The emitter-to-collector circuit of transistor 23 is connected in shunt between the base and emitter terminals of a first switching transistor 27. Similarly, the collector-to-emitter circuit of transistor 24 serves to shunt the base and emitter terminals of second switching transistor 28. Resistor 29 serves to couple the base of transistor 27 to the collector of transistor 28, while resistor 30 in similar manner connects the base of transistor 28 to the collector of transistor 27. Further, a pair of series-connected resistors 31, 32 connect the collector of transistor 27, designated point A, to that of transistor 28 which is designated point B. In parallel with resistors 31 and 32, and also connected between the collectors of transistors 27 and 28, is a potentiometer 38 including a resistive element 39 and a slider 40. The control winding of a relay 19 is coupled between a suitable source of positive potential $V_p$ and the junction between resistors 31 and 32. The slider 40 of potentiometer 38 is connected through the switched terminals of relay 19 and through series resistors 41 and 42 to the gate terminal of a voltage-controlled device having a high input impedance such as a metal oxide semiconductor field effect transistor (MOSFET) 43. A capacitor 44 is connected in shunt between the gate terminal of MOSFET 43 and ground for accumulating charge to control the operation of MOSFET 43 is a predetermined manner. The source terminal of MOSFET 43 is connected to ground by means of resistor 45, while the drain terminal thereof may be connected directly to a source of positive potential $V_p$.

The voltage applied to capacitor 44, and thus to the gate terminal of MOSFET 43, is limited by a zener diode 50 coupled between a point of ground potential and the intersection of resistors 41 and 42 by means of a potentiometer 52.

Th operation of the circuit disclosed in FIG. 2 will now be discussed. For purposes of illustration it will initially be assumed that an acceptable signal is being outputted by the tuner 11 so that the sensed carrier frequency closely approximates the desired central frequency $f_o$. Should the carrier frequency now begin to drift below $f_o$, a more positive voltage will appear at output terminal 15 of the bipolar discriminator 13 and a voltage excursion of similar magnitude, but in the opposite sense, will occur at terminal 14. The signals thus produced are applied to input terminals 17 and 16 of the tuner control, respectively. It will be seen that the positive-going voltage appearing at output terminal 15 of the bipolar discriminator, which is applied to input terminal 17, traverses decoupling resistor 21 and raises the voltage of the base terminal of shunting transistor 23. Although the base terminal of transistor 23 is also coupled to a source of negative potential $V_n$, the presence of resistor 25 and its relation to resistor 21 (as well as the valve $V_n$ compared to the value of the voltage of terminal 17) prevents the negative potential $V_n$ from maintaining a negative bias upon the base of the transistor 23. Thus, when a positive-going voltage appears at input terminal 17 transistor 23 becomes conductive and shunts the base terminal of switching transistor 27 to the emitter terminal thereof, rendering transistor 27 nonconductive.

At the same time, the negative-going voltage appearing at input terminal 16 is transferred across decoupling resistor 22 to the base terminal of shunting transistor 24. Resistor 26 precludes the negative potential source $V_n$ from continuing to bias transistor 24 in a non-conductive mode in the presence of a positive error signal, but serves to maintain transistor 24 in a nonconductive mode in the presence of a negative-going error signal. The base terminal of switching transistor 28 thus remains electrically isolated from the emitter thereof. Since the base terminal is coupled by way of resistor 30 to point A, the state of transistor 28 will reflect the voltage at the collector of transistor 27. In the instant situation, since switching transistor 27 has been rendered nonconductive due to the presence of a positive voltage at input terminal 17, the voltage at point A will rise to approximately that of the positive voltage source $V_p$. This relatively high voltage is thus applied to the base of switching transistor 28 by means of resistor 30 causing transistor 28 to become conductive. In its conductive mode, switching transistor 28 effectively shunts point B to ground potential. In the described circumstance it will be seen that a positive potential approximating $V_p$ is present at point A at the left side of the serial combination of resistors 31 and 32 and at the left side of the resistive element 39 of potentiometer 38. For purposes of illustration it will be assumed that resistors 31 and 32 are of approximately the same value so that the control circuit is substantially symmetrical. Current now flows through the control winding of relay 19, causing the contacts thereof to close and applying a voltage derived at slider 40 of potentiometer 38 to ramp generator 20. For the present, it will be assumed that the slider 40 of potentiometer 38 is adjusted to the left of center such that voltage greater than ½ $V_p$ is applied to slider 40.

In order to limit the voltage applied to ramp generator 20 to a predetermined maximum value, zener diode 50 is coupled by means of potentiometer 52 to the intersection of resistors 41 and 42. As will be understood by those skilled in the art, zener diode 50 begins to conduct at a fixed voltage level, the effect of which may be modified by adjusting the slider of potentiometer 52. This prevents the voltage applied to the ramp generator from exceeding a predetermined, maximum value regardless of the position of slider 40. The presence of resistors 41 and 42 prevents the voltage derived from instantaneously charging capacitor 44. Instead, charge accumulates upon capacitor 44 at a rate determined by the values of the capacitor, the resistances in the circuit, and the maximum applied potential as determined by potentiometer 52 and zener diode 50. As capacitor 44 charges, the voltage at the gate terminal of MOSFET 43 rises. This rise is reflected in the commensurately increasing source-to-drain conductivity of the MOSFET. The increasing current flow through MOSFET 43 effects a related increase in the voltage drop across resistor 45 such that the voltage produced at output terminal 46 causes the voltage-controlled tuner 11 to output a converted signal of increasing frequency.

As the converted frequency rises, it approaches the desired frequency range about the desired central frequency $f_o$. When the converted frequency is sufficiently close to $f_o$, the error voltages outputted by the discriminator both fall to near zero. A positive discriminator reference voltage remains supplied to terminal 16 and 17. Sufficiently large positive bias thus remains upon the base terminals of shunting transistors 23 and 24 so that the shunting transistors remain conductive in the absence of negative-going error voltages.

The non-conduction of switching transistors 27 and 28, resulting from the conductive states of shunting transistors 23 and 24, precludes current flow through resistors 31 and 32 and so disables relay 19. Relay 19 now opens, isolating capacitor 44 of ramp generator 20. As described above, the MOSFET 43 utilized in the ramp generator is selected to have a high input impedance, or, equivalently, low leakage input characteristics so that capacitor 44 discharges therethrough at an extremely slow rate. To further prevent leakage or discharge MOSFET 43, capacitor 44 and resistor 45 may be encapsulated in a suitable epoxy potting compound. With the charge upon capacitor 44 constant, the conductivity of MOSFET 43, and thus the voltage outputted at terminal 46, remains at a fixed value.

Should the carrier frequency monitored by the bipolar discriminator rise above the desired central frequency range, error signals are produced which are opposite in polarity to those in the last mentioned case. In this instance, a negative-going error voltage is applied to input terminal 17, and a positive-going error voltage to terminal 16. Shunting transistor 24 remains conductive for disabling switching transistor 28. Shunting transistor 23, however, becomes nonconductive so that switching transistor 27 is driven into conduction by the positive voltage at point B, the collector terminal of inoperative transistor 28. Since almost no current is drawn through resistor 32 it will be seen that point B now attains a positive potential approximating $V_p$, while point A is shunted to ground by transistor 27. Current now flows through the winding of relay 19, transistor 31 and transistor 27. Due to its position near the leftward end of resistive element 39, the voltage appearing at the slider 40 of potentiometer 38 is now less than ½ $V_p$, substantially lower than the slider voltage produced when point A was at voltage $V_p$. With point A at substantially ground potential and point B at a voltage of approximately $V_p$, the asymmetrical adjustment of slider 40 results in the application of a substantially lower voltage to ramp generator 20. This lower voltage will be assumed to be less than the voltage needed to bias zener diode 50 into conduction. The now-lowered voltage is applied to capacitor 44 by means of resistors 41 and 42, causing capacitor 44 to discharge. As the capacitor discharges, the declining voltage appearing at the gate terminal of MOSFET 43 causes the device to become less conductive, resulting in the production of a lessening voltage drop across resistor 45 and thus in a decreasing voltage applied to the tuner stage by way of output terminal 46. The decrease in applied voltage then causes the converted signal produced by the voltage-controlled tuner to decline until it approximates the desired frequency $f_o$. At this point the error voltage outputted by the bipolar discriminator again drops to an insignificant value. Transistor 23 then becomes conductive, shunting the base of transistor 27 to ground. With transistor 27 disabled, the voltage of point A is free to rise to its quiescent value of approximately $V_p$. The voltage differential between the junction of resistors 31 and 32 and $V_p$ diminishes to the point that insufficient current flows through the winding of relay 19, and the switch contacts open. With switch of relay 19 open, capacitor 44 of the ramp generator 20 is electrically isolated and the output voltage produced at terminal 46 of ramp generator 20 remains constant.

When the converted frequency applied to the bipolar discriminator 13 deviates from the desired frequency $f_o$ by an amount which is beyond the range of the discriminator, the discriminator error voltages approach zero. This condition corresponds to a period during which the tuner is "between channels." At this time, since no signal is produced by the discriminator, the tuner control remains in its quiescent state. In this mode, the control 18 is incapable of passing sufficient current through the control winding of relay 19 to cause the switch contacts to close, and the ramp generator thus remains isolated from the tuner control. This allows other control voltages to be independently applied to the voltage-controlled tuner to cause it to scan from one channel to the next. Further, other means may be provided for modifying the conductivity of MOSFET 43 of the ramp generator such that the ramp generator itself may be utilized as a means for scanning a range of channels. When a new channel is approached and the converted frequency approaches $f_o$, the discriminator 13 again produces an error signal for energizing the tuner control. The control then produces a suitable signal for causing the tuner to "home in" on the channel with no further supervision.

Such a system is the subject matter of my copending application Ser. No. 158,015, filed concurrently herewith. While it will be recognized by those skilled in the art that values and relationships of curcuit components are susceptible of considerable variation, in one successfully constructed embodiment of the present invention circuit elements were utilized having the following values:

| | |
|---|---|
| Resistors | |
| 21 | 68 kilohms |
| 22 | 68 kilohms |
| 25 | 1 megohm |
| 26 | 1 megohm |
| 29 | 33 kilohms |
| 30 | 33 kilohms |
| 31 | 22 kilohms |
| 32 | 2.2 kilohms |
| 41 | 160 kilohms |
| 42 | 12 megohms |
| 45 | 6.8 kilohms |
| Potentiometers | |
| 38 | 0–20 kilohms |
| 52 | 0–100 kilohms |
| Transistors | |
| 23 | Type 16 E (General Electric) |
| 24 | " |
| 27 | " |
| 28 | " |
| MOSFET 43 | 2N4351 (Motorola) |
| Diode 30 | IN4737 (Motorola) |
| Capacitor 44 | 0.33 microfarads, polystyrene |
| Switch 19 | 900 turns of No. 41 wire on spool about General Electric reed switch DR 125 |

It will now be seen that there has been provided improved means for causing a voltage-controlled tuner to be kept within a defined operating range. The control receives a signal from a discriminator and produces a response in the form of a first, higher, or a second, lower voltage to produce a continuously-variable voltage to correct the operation of a voltage-controlled tuner.

As will be evident from the foregoing description, certain aspects of the invention are not limited to the particular details of construction of the example illustrated, and it is therefore contemplated that other modifications or applications will occur to those skilled in the art. It is therefore intended that the appended claims shall encompass all such modifications and applications as do not depart from the true spirit and scope of the invention.

What is claimed as new and desired to be secured by Letters Patent of the United States is:

1. In a television receiver including a voltage-controlled timing means for outputting a converted signal:

discriminator means for producing a first signal having a first polarity when the frequency of the converted signal is less than a predetermined frequency, and for producing a second signal having a second polarity when the frequency of the converted signal is greater than said predetermined frequency, and for producing a third signal when the frequency of the converted signal is equal to said predetermined frequency;

control means connected for receiving said signals produced by said discriminator means, said control means producing a first, higher, voltage in response to said first signal and producing a second, lower, voltage in response to said second signal and producing a third voltage in repsonse to said third signal;

ramp generator means connected for receiving said first, second, and third voltages, said ramp generator producing a voltage continuously changing in a first direction upon reception of said first, higher, voltage and continuously changing in a second direction upon reception of said second, lower, voltage and remaining at constant amplitude upon reception of said third voltage; and means for applying the voltage produced by said ramp generator means to the voltage-controlled tuning means.

2. The invention as defined in claim 1, wherein said discriminator means is provided with a first and a second output terminal, said discriminator means producing error signals at said output terminals which have opposite polarities.

3. The invention as defined in cliain 2, further including switch means for coupling said control means to said ramp generator means upon the reception by said control means of an error signal from said discriminator means, and for decoupling said control means and said ramp generator means when said error signal is no longer received.

4. The invention as defined in claim 3, wherein said control means further comprises a first and a second input terminal, second switch means adapted to be energized upon reception of an error signal having a first polarity at said first input terminal, and third switch means adapted to be energized upon the reception of an error signal having a first polarity at said second input terminal.

5. The invention as defined in claim 4, further including circuit means coupled between said second and said third switch means for deriving a first, higher voltage when said second switch means is energized and a second, lower voltage when said third switch means is energized.

6. Control means for causing a voltage-controlled tuner to operate within a desired range, comprising:

first switching means adapted to be coupled across a source of direct potential, said first switching means being energized upon the reception of an error signal having a first polarity;

second switch means adapted to be coupled across the source of direct potential, said second switching means being energized upon reception of an error signal having a second polarity;

impedance means coupled between common terminals of said first and second switching means for providing a first, higher voltage when one of said switching means is energized and a second, lower voltage when the other of said switching means is energized;

voltage means for producing a continuously changing voltage;

third switching means for applying the voltage provided by said impedance means to said voltage means; and means coupled to said voltage means for applying a control voltage to the voltage-controlled tuning means in response to said continuously changing voltage.

7. The invention as defined in claim 6, wherein said first switching means comprises first transistor means operatively coupled across a source of direct potential, and second transistor means adapted to receive said error signal for disabling said first transistor means; and said second switching means comprises third transistor means adapted to be coupled across a source of direct potential, and fourth transistor means adapted to receive said error signal for disabling said third transistor means.

8. Th invention as defined in claim 7, wherein said impedance means comprises a potentiometer including a resistive element coupled between corresponding terminals of said first and said third transistor means, the adjustable element of said potentiometer being adapted to be connected to said third switching means.

9. The invention as defined in claim 8, further including means for limiting the voltage applied to said voltage means.

10. The invention as defined in claim 9, wherein said means for applying a control voltage to the voltage-controlled tuning means comprises fifth transistor means including a control terminal and an input and an output terminal, said control terminal being operatively coupled to said capacitor means, said input and output terminals being adapted to be resistively coupled across a source of direct potential.

* * * * *